(12) United States Patent
Zuschlag et al.

(10) Patent No.: US 10,507,779 B2
(45) Date of Patent: Dec. 17, 2019

(54) METHOD AND DEVICE FOR DETECTING A USABILITY OF A CONTROL DEVICE

(71) Applicant: ROBERT BOSCH GMBH, Stuttgart (DE)

(72) Inventors: Rainer Zuschlag, Ludwigsburg (DE); Hartmut Schumacher, Freiberg (DE)

(73) Assignee: Robert Bosch GmbH, Stuttgart (DE)

( * ) Notice: Subject to any disclaimer, the term of this patent is extended or adjusted under 35 U.S.C. 154(b) by 138 days.

(21) Appl. No.: 14/374,743

(22) PCT Filed: Jan. 14, 2013

(86) PCT No.: PCT/EP2013/050565
§ 371 (c)(1),
(2) Date: Jul. 25, 2014

(87) PCT Pub. No.: WO2013/110523
PCT Pub. Date: Aug. 1, 2013

(65) Prior Publication Data
US 2015/0008933 A1    Jan. 8, 2015

(30) Foreign Application Priority Data
Jan. 25, 2012 (DE) .................. 10 2012 201 049

(51) Int. Cl.
*B60R 21/017* (2006.01)
*G01R 31/00* (2006.01)
*G01R 31/28* (2006.01)

(52) U.S. Cl.
CPC ........ *B60R 21/0173* (2013.01); *G01R 31/006* (2013.01); *G01R 31/2813* (2013.01)

(58) Field of Classification Search
CPC .............. B60R 21/01; B60R 21/01006; B60R 21/01286; B60R 21/017; B60R 21/0173;
(Continued)

(56) References Cited

U.S. PATENT DOCUMENTS 5,898,122 A * 4/1999 Davis .................... B60R 21/017
102/202.5
5,929,535 A * 7/1999 Fendt .................... B60R 21/017
180/268
(Continued)

FOREIGN PATENT DOCUMENTS

DE      39 20 693      1/1991
DE      44 32 301      3/1996
(Continued)

OTHER PUBLICATIONS

International Search Report for PCT/EP2013/050565, dated Apr. 8, 2013.

*Primary Examiner* — Steven L Yeninas
(74) *Attorney, Agent, or Firm* — Norton Rose Fulbright US LLP; Gerard Messina

(57) ABSTRACT

A method for recognizing a usability of a control device of a safety device in a vehicle includes: applying a voltage to the control device; acquiring a voltage curve or a current curve at the control device; and recognizing a usability of the control device as a function of the acquired voltage curve or of the acquired current curve. In particular, the correct polarity of an inductive actuator having a freewheeling diode is recognized, because in the case of incorrect polarity the inductive actuator is bridged by the freewheeling diode.

19 Claims, 10 Drawing Sheets

(58) Field of Classification Search
CPC ....... B60R 21/0176; B60R 2021/01122; B60R 2021/01129; B60R 2021/01143; B60R 2021/0115; B60R 2021/01156; B60R 2021/01177; B60R 2021/01184; B60R 2021/0119; G01R 31/006; G01R 31/2813; G01R 31/2829; G01R 31/06; G01R 31/007
USPC ....... 324/503, 546, 502, 527, 532; 702/29.7, 702/29.8, 30.2, 30.3, 30.4, 30.5, 30.7, 702/30.9, 31.1, 33.7, 33.8, 33.9; 280/734, 280/735; 307/10.1; 340/514, 515; 701/45, 46
See application file for complete search history.

(56) References Cited

U.S. PATENT DOCUMENTS

| | | | | |
|---|---|---|---|---|
| 5,936,313 | A * | 8/1999 | Cook, Jr. | B60R 21/017 180/282 |
| 5,977,651 | A * | 11/1999 | Ueda | B60R 21/017 180/271 |
| 6,114,777 | A * | 9/2000 | Hermann | B60R 21/017 180/271 |
| 6,495,930 | B1 * | 12/2002 | Hermann | B60R 21/0173 307/10.1 |
| 7,209,819 | B2 * | 4/2007 | Rothleitner | B60R 21/017 307/10.1 |
| 9,419,523 | B2 * | 8/2016 | Wolfarth | H02M 3/158 |
| 9,981,621 | B2 * | 5/2018 | Walker | G01R 31/2813 |
| 2005/0200203 | A1 * | 9/2005 | Uono | B60R 21/017 307/10.1 |
| 2007/0030016 | A1 * | 2/2007 | Schumacher | B60R 21/0173 324/678 |
| 2009/0072809 | A1 * | 3/2009 | Kaltenegger | G01R 31/024 324/76.11 |
| 2009/0108849 | A1 * | 4/2009 | Berg | G01R 31/06 324/546 |
| 2010/0165538 | A1 * | 7/2010 | Hemon | B60R 21/017 361/248 |
| 2011/0012568 | A1 * | 1/2011 | Schumacher | B60R 21/017 320/166 |
| 2014/0043034 | A1 * | 2/2014 | Hemon | B60R 21/0173 324/503 |
| 2015/0008933 | A1 * | 1/2015 | Zuschlag | B60R 21/0173 324/503 |

FOREIGN PATENT DOCUMENTS

| | | | |
|---|---|---|---|
| DE | 195 30 238 | 2/1997 | |
| DE | 19530588 | 2/1997 | |
| DE | 195 32 628 | 3/1997 | |
| DE | 19826704 | 2/2000 | |
| DE | 10 2004 042 364 | 6/2005 | |
| DE | 10 2005 054738 | 2/2007 | |
| EP | 577988 | 1/1994 | |
| JP | 01117517 A | 5/1989 | |
| JP | H1024826 A | 1/1998 | |
| JP | H11218256 A | 8/1999 | |
| JP | 2002324710 A | 11/2002 | |
| JP | 2008068825 A | 3/2008 | |
| WO | WO 2012143750 A1 * | 10/2012 | ......... B60R 21/0173 |

* cited by examiner

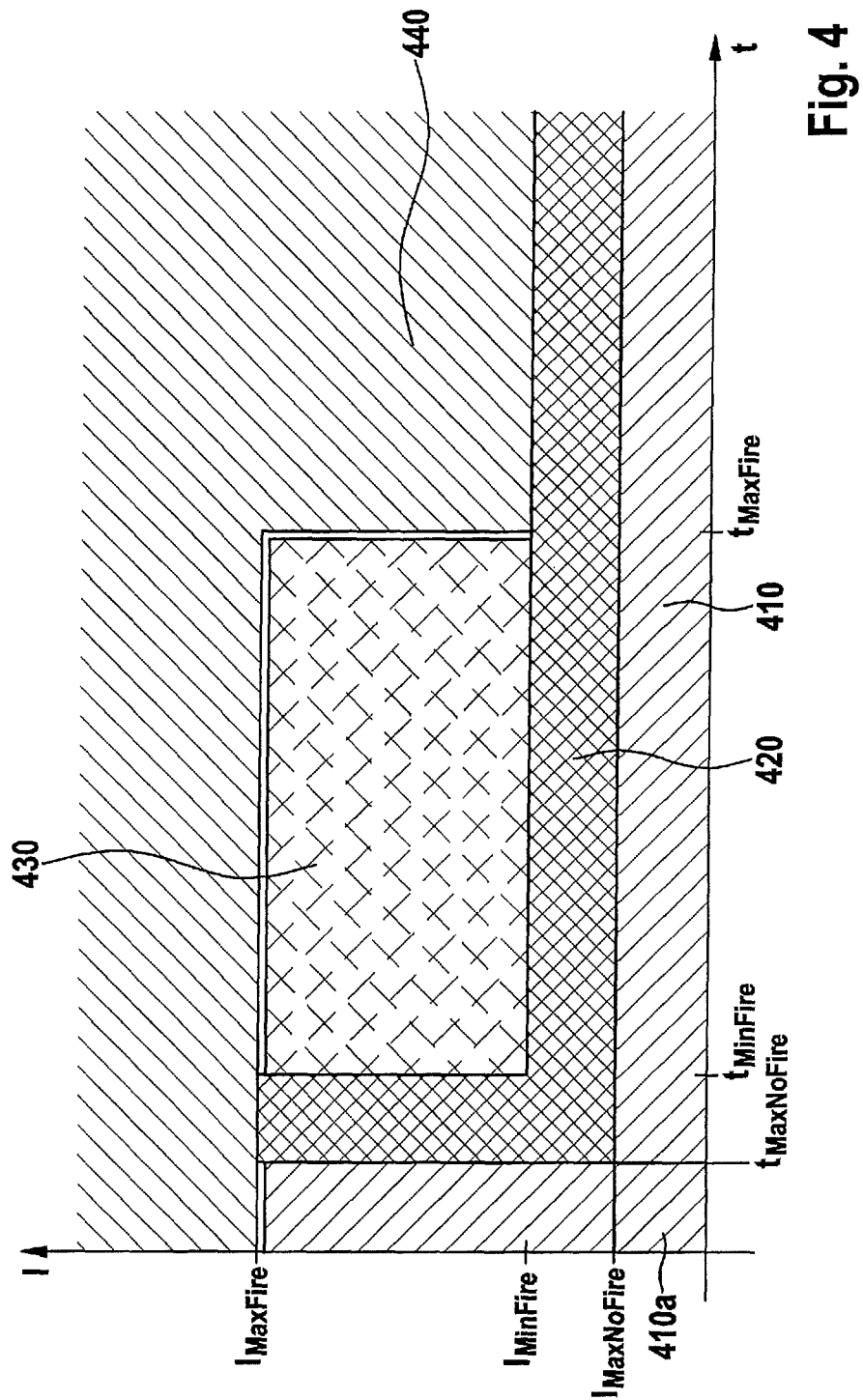

METHOD AND DEVICE FOR DETECTING A USABILITY OF A CONTROL DEVICE

BACKGROUND OF THE INVENTION

1. Field of the Invention

The present invention relates to a method and a device for recognizing a usability of a control device of a safety device in a vehicle.

2. Description of the Related Art

Currently, in the recognition of usability of a control device for a safety device in a vehicle, for example a firing pellet in a pyrotechnic actuator, only the presence of the actuator is determined by an ignition circuit measurement.

In an ignition circuit measurement, the resistance value of the actuator is measured and it is determined whether a short-circuit to an external voltage is present.

With the currently used measurement method, it cannot be determined whether an actuator having a preferred direction of current has been installed in the correct direction.

BRIEF SUMMARY OF THE INVENTION

The core idea of the present invention is to provide a method and a device with which a usability of a control device of a safety device can be recognized. For this purpose, the method or device uses a limited quantity of energy, so that unwanted triggering of the safety device is excluded.

The present invention creates a method for recognizing a usability of a control device of a safety device in a vehicle, having the steps:
  application of a voltage to the control device
  acquisition of a voltage curve and/or current curve at the control device
  recognition of a usability of the control device as a function of the acquired voltage curve and/or current curve.

In addition, the present invention creates a device for recognizing a usability of a control device of a safety device of a vehicle, the device having
  means for applying a voltage to the control device;
  means for acquiring a voltage curve at the control device;
  means for recognizing a usability of the control device as a function of the acquired voltage curve.

In the present context, a safety device in a vehicle can be understood as referring to any device in a vehicle that protects the occupants, the vehicle, or other traffic participants from harm. This includes for example roll bars, active engine hoods, active vehicle seats. Active engine hoods are engine hoods that are moved by a suitable actuator in order to protect another traffic participant (pedestrian, bicyclist, motorcyclist) from serious injury if such participant strikes the hood during a collision. Active vehicle seats are seats that, in the case of a collision or even during the time immediately preceding a collision, moves the occupants into an optimal position so that further safety devices can deploy maximum protective effects.

A control device for such a safety device in a vehicle can be understood in the present context as referring to any device that is suitable for activating, triggering, moving, or setting a safety device. For example, a control device can be a magnetic actuator for controlling safety devices in a vehicle. A magnetic actuator can be realized as a coil (inductor) that produces a magnetic field when controlled or activated by a current pulse. Such a magnetic field then exerts a force on a magnetizable material that thereupon moves in the magnetic field. The movement in turn can result in the releasing of a holding device, thereby triggering a safety device. For example, this can take place in that the safety device itself stands under mechanical tension and the energy stored in the tension is freed by the releasing of the holding device. In most cases, such a magnetic actuator has a freewheeling diode parallel to the coil.

In the present context, a freewheeling diode can be understood as a diode that is connected in such a way that, in the case of incorrect polarity, a current, instead of flowing through the actuator, flows through the freewheeling diode, thus protecting the actuator from possible destruction or faulty activation.

In the present context, a usability of such a control device can be understood as a determination that the control device, if it has a preferred direction of current flow, has been installed in the correct direction, for example with correct polarity. An actuator installed with the wrong polarity is not capable of activating or triggering a safety device.

In the present context, a device for recognizing such a usability can be understood as a component, preferably an electric component, that is either accommodated separately in the vehicle and correspondingly connected to the control device whose usability is to be recognized, or is part of a control device for controlling safety devices, for example part of an airbag control device or a so-called safety unit. A safety unit is a control device that is configured, inter alia, to control or to activate a wide range of safety devices in a vehicle.

In an advantageous embodiment, the method according to the present invention includes the feature that, in the step of application, a voltage from a separate energy source is applied, and includes the additional step:
  charging of the separate energy reserve.

In the present context, a separate energy reserve can be understood as any component capable of storing electrical energy. Preferably, this is understood in the present context as a capacitor, a battery, or an accumulator.

It is additionally advantageous if the vehicle has a further energy source, and that the separate energy source can be connected via a first switch (SVS) to the energy source of the vehicle, and that in the step of charging the separate energy source is charged via connection to the energy source of the vehicle by the first switch (SVS), in particular by closing the first switch (SVS).

It is further advantageous that in the step of charging, after the charging of the separate energy source the connection to the energy source of the vehicle by the first switch (SVS) is disconnected, in particular by opening the first switch (SVS).

In the present context, a further energy source of the vehicle can be understood as any component capable of storing electrical energy. Preferably, in the present case this is understood as a vehicle battery.

In the present case, "can be connected" can be understood as meaning that an electrical connection prevails between the two components that can be completely created by a suitable component. Such a component can be for example a correspondingly constructed switch, but can also be a part of an integrated circuit to which the two components are connected.

In the present context, a first switch (SVS) can be understood as any component suitable for switching. Preferably, in the present context this is understood as an electrical switch or a part of an integrated circuit. This first switch can be realized by a so-called safety switch of a control device.

The safety switch is situated in the electrical circuit on a serial path from the energy source to the control device or to the actuator. A safety switch is distinguished in that a triggering or activation of the control device or of the actuator is possible only when the safety switch is closed.

In an advantageous embodiment, the present invention includes—if the control device has a time boundary value ($t_{MaxNoFire}$) or has a current boundary value ($I_{MaxNoFire}$) and the control device does not trigger if a voltage is applied to the control device for at most a time that corresponds to the time boundary value ($t_{MaxNoFire}$) and the control device does not trigger if a current flows through the control device that at most corresponds to the current boundary value ($i_{MaxNoFire}$)—a further step:

disconnection of the applied voltage after at most the time corresponding to the time boundary value ($t_{MaxNoFire}$) or before a current flows corresponding to the current boundary value ($i_{MaxNoFire}$).

In the present context, a time boundary value ($t_{MaxNoFire}$) can be understood as being a maximum time duration within which an actuator, or a control device, according to the present invention will not activate or trigger the safety device. Such a time duration can be a consequence of the design of the control device, or can be provided by the design of the control device.

In the present context, a current boundary value ($i_{MaxNoFire}$) can be understood as a current, or a current strength, that can permanently flow through an actuator or a control device of the present invention without resulting in an activation or triggering of the safety device. Such a current, or such a current strength, can be a consequence of the design of the control device, or can be provided by the design of the control device, for example by the properties of a coil in the case of a magnetic actuator.

For the triggering or activation of a control device or of an actuator of the present invention, a minimum current must flow, for a minimum time duration, through a coil of the control device or of the actuator. This minimum time duration is longer than the time boundary value ($t_{MaxNoFire}$) and the minimum current is greater than the current boundary value ($I_{MaxNoFire}$)

In an advantageous embodiment, the method according to the present invention includes the feature that the usability is recognized when the acquired voltage curve has a characteristic rise in voltage.

In an advantageous embodiment, the method according to the present invention includes the feature that the usability is recognized as not present when the acquired voltage curve does not have a characteristic rise in voltage.

In the present context, a characteristic rise in voltage can be understood as meaning that, when a voltage is applied, in the first moment no current flows through a coil of the control device or of the actuator of the present invention. An abrupt rise in voltage results from the application of a voltage. This rise in voltage is characteristic and can be measured, or back-measured, and the applied voltage can be disconnected or switched off before a current has begun to flow that is greater than the current boundary value. In each case, the applied voltage is disconnected or switched off before the voltage has been applied for a time boundary value.

In cases in which a control device or actuator of the present invention is not usable, e.g. because it has been connected with incorrect polarity, the expected abrupt rise in voltage does not occur. What is then measured, or back-measured, is then only a voltage, or a forward voltage, that is measured at other components, for example at a freewheeling diode.

In an alternative realization of the method according to the present invention, or the device according to the present invention, the characteristic rise in voltage, or rise in current, is distinguished in that if usability is present, a first voltage curve is acquired having a first rise in voltage and a second voltage curve is acquired having a second rise in voltage, and the first rise in voltage takes place faster, or clearly faster, than the second rise in voltage.

If usability is not present, a first voltage curve having a first rise in voltage and a second voltage curve having a second rise in voltage are acquired, and the first and second voltage curves take place with the same speed, or substantially the same speed.

It is further advantageous that in the step of recognition the acquired voltage curve is compared to a voltage boundary value ($U_{Grenz}$). If in the step of recognition the acquired voltage curve deviates from the voltage boundary value ($U_{Grenz}$), the method according to the present invention recognizes that the control device or actuator is not usable. The deviation can be that a boundary value is not reached, or that a boundary value cannot be reached. A corresponding signal can thereupon be outputted that can be used for example to give the driver of the vehicle a suitable warning indication, for example by controlling a warning lamp, or the signal can be used to store an error message in a suitable storage device.

In an advantageous embodiment, the method according to the present invention includes the feature that a usability of the control device of the safety device is a correct polarity of the control device.

In the present context, a polarity can be understood as meaning that the control device or the actuator of the present invention is an electrical component that has at least one terminal for a positive voltage and one terminal for a negative voltage. A connection of these terminals to a voltage source or energy source for electrical energy is referred to as polarity. A correct polarity is present when the terminal for a negative voltage is connected to a terminal for negative voltage of the voltage or energy source, and correspondingly the terminal for a positive voltage is connected to a terminal for positive voltage. A faulty or reverse polarity is present when the terminal for negative voltage is connected to the terminal for positive voltage of the voltage or energy source, and correspondingly the terminal for positive voltage is connected to the terminal for negative voltage.

In an advantageous embodiment, the method according to the present invention includes the feature that the voltage can be applied to the control device by at least one second switch (HS), a voltage being applied in the step of application using the at least one second switch (HS), in particular the at least one second switch being closed.

In the present context, a second switch (HS) can be understood as being any component suitable for switching. Preferably, in the present context this is understood as an electrical switch or a part of an integrated circuit. This second switch can be realized by a so-called high-side switch of a control device. In the electrical circuit, the high-side switch is situated upstream, in the direction of current flow, from the component that is to be controlled or activated.

The second switch (HS), or high-side switch, is advantageously suitable for acquiring the voltage curve at said switch. Because the second switch (HS) or high-side switch is generally present in control devices, and in most cases a voltage acquisition at the high-side switch is already provided in relation to other functions, no additional outlay is incurred through further use of the acquired voltage by the method according to the present invention or device according to the present invention in the realization of the method according to the present invention or of the device according to the present invention.

In an advantageous embodiment, the method according to the present invention includes the feature that the control device can be triggered by the at least one second switch (HS) and an at least one third switch (LS), and that in the step of application a triggering is prevented by the at least one third switch (LS); in particular, the at least one third switch is not closed.

In the present context, a third switch (LS) can be understood as any component suitable for switching. Preferably, in the present context this is understood as an electrical switch or a part of an integrated circuit. This third switch can be realized by a so-called low-side switch of a control device. In the electrical circuit, the low-side switch is situated downstream, in the direction of current flow, from the component that is to be controlled or activated.

For an alternative realization of the method according to the present invention, the third switch (LS), or low-side switch, is likewise advantageously suitable for acquiring the voltage curve thereat. Because the third switch (LS), or low-side switch, is generally present in control devices, and in most cases a voltage acquisition at the low-side switch is already provided in relation to other functions, no additional outlay is incurred through further use of the acquired voltage by an alternative realization of the method according to the present invention or device according to the present invention.

In an advantageous embodiment, the device according to the present invention has a separate energy source for providing a voltage for application to the control device.

It is further advantageous, if the vehicle has a further energy source, that the device according to the present invention has a first switch, the separate energy source being capable of being connected, through a first switch (SVS), to the energy source of the vehicle, and the device charges the separate energy source through connection to the energy source of the vehicle by the first switch (SVS), in particular by closing of the first switch (SVS).

It is further advantageous that the device according to the present invention disconnects the energy source of the vehicle by the first switch (SVS), in particular by opening the switch.

In an advantageous embodiment, the device according to the present invention includes the feature that—if the control device has a time boundary value ($t_{MaxNoFire}$) or has a current boundary value ($i_{MaxNoFire}$) and the control device does not trigger if a voltage is applied to the control device for at most a time that corresponds to the time boundary value ($t_{MaxNoFire}$) and the control device does not trigger if a current flows through the control device that at most corresponds to the current boundary value $i_{MaxNoFire}$)—that the separate energy reserve has a capacitor, the capacitor being capable of storing at most so much energy that the voltage can be applied to the control device for at most a time that corresponds to the time boundary value ($t_{MaxNoFire}$), or the voltage can be applied for at most a time duration until a current flows that corresponds to the current boundary value ($I_{MaxNoFire}$)

In an advantageous embodiment, the device according to the present invention includes the feature that the control device has at least one second switch (HS) and at least one third switch (LS), and for controlling the safety device the at least one second switch (HS) and the at least one third switch (LS) are closed, and the means for applying a voltage for applying the voltage close the at least one second switch (HS) and do not close the at least one third switch (LS).

In an advantageous embodiment, the device according to the present invention includes the feature that the separate energy reserve is situated between the first switch (SVS) and the at least one second switch (HS).

The device according to the present invention is advantageously used for control devices that have at least one electrical component, such a component having an inductive character.

In the present context, a component having an inductive character can be understood as any element that is suitable for producing a magnetic field, such as an electric coil.

The method according to the present invention can be realized completely by a suitable program stored on a data carrier and executed by a correspondingly configured computing unit, for example by a microcontroller (µC). It is also conceivable to realize the method according to the present invention completely or also partially through suitable circuits realized in hardware.

In this context, it is conceivable that the first switch (SVS) or safety switch is controlled by a suitable program that is stored on a data carrier and executed by a correspondingly configured computing unit, for example by a microcontroller (µC), and the second switch (HS), or high-side switch, and third switch (LS), or low-side switch, are controlled by a separate hardware path.

Further features, possible applications, and advantages of the present invention result from the following description of exemplary embodiments of the present invention shown in the drawings of the Figures. Here, all described or presented features form the subject matter of the present invention, alone or in arbitrary combination, independent of their summarization in the patent claims or relations of dependence thereof, and independent of their formulation or presentation in the description or in the drawings.

BRIEF DESCRIPTION OF THE DRAWINGS

FIG. 4 shows a diagram having boundary values for a current.

DETAILED DESCRIPTION OF THE INVENTION

Figure 1:
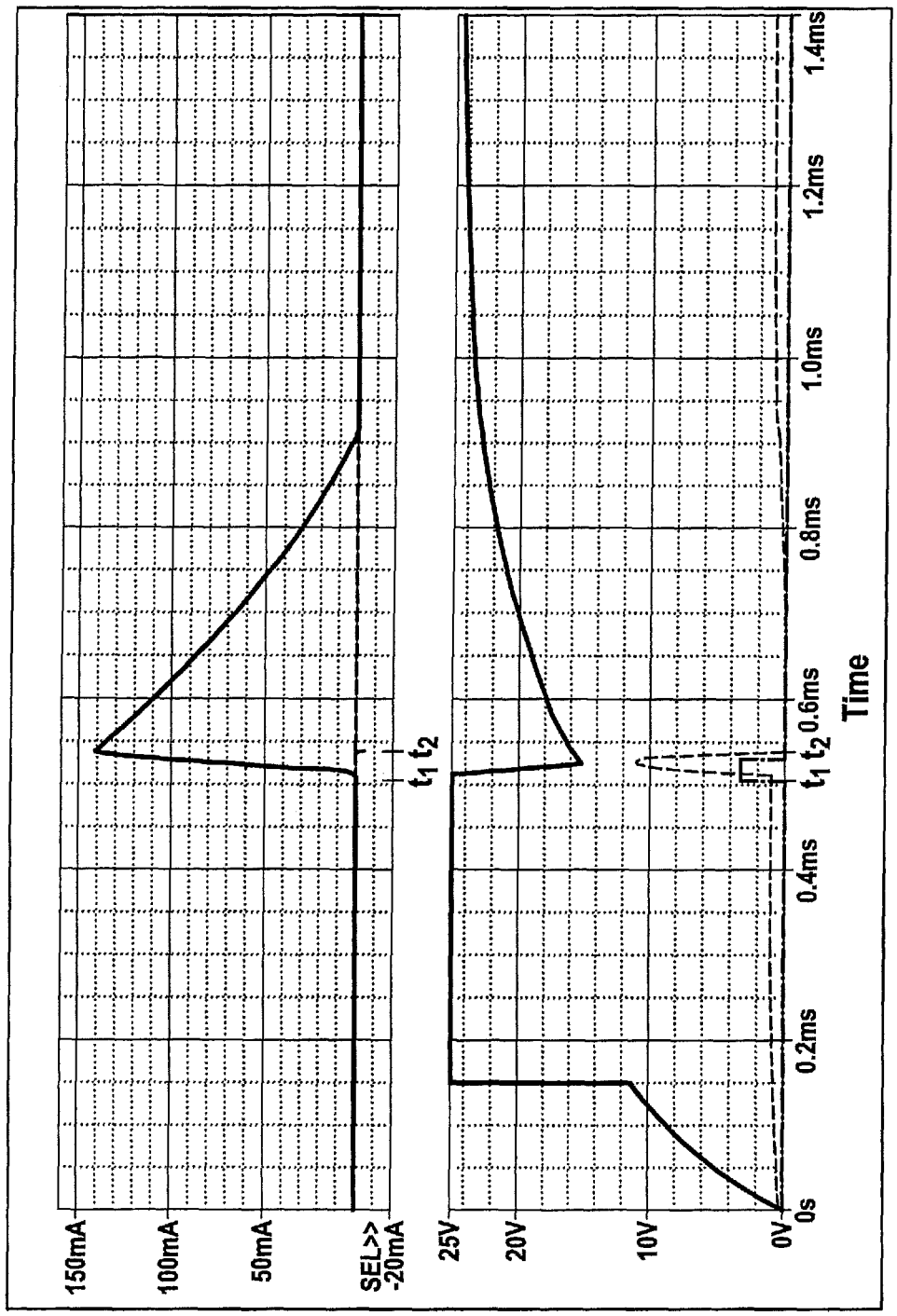
FIG. 1 shows a diagram of a voltage/current curve.

FIG. 1 shows a diagram of an acquired voltage and current curve during the execution of the method according to the present invention by the device according to the present invention, if the control device or the actuator of the present invention has correct polarity.

In the upper diagram, the curves are plotted over time of the current through the control device, or the actuator, and through the freewheeling diode. The solid line indicates the current curve through the control device or the actuator. The dashed line indicates the current curve through the freewheeling diode.

In the lower diagram, the curves are plotted over time of the voltages at the separate energy source, e.g. an EMV capacitor, and at the second switch (HS), or high-side switch, as well as the voltage curve for the controlling of the second switch (HS), or high-side switch, and the third switch (LS), or low-side switch. Here, the solid line indicates the voltage curve at the separate energy source, e.g. an EMV capacitor, and the dashed line indicates the voltage curve at the second switch (HS), or high-side switch, and the dot-dash line indicates the voltage curve for the controlling of the second switch (HS), or high-side switch, and of the third switch (LS), or low-side switch, by a processing device (μC).

It can be seen clearly that at time t1 of the application of a voltage, there takes place a rise in voltage in the voltage curve at the second switch (HS), or high-side switch (lower diagram, dashed line). At the same time, it can be seen that a current begins to flow through the actuator (upper diagram, solid line). The current through the freewheeling diode does not show any significant value (upper diagram, dashed line). From this the usability of the control device, or of the actuator, can be recognized.

Figure 2:
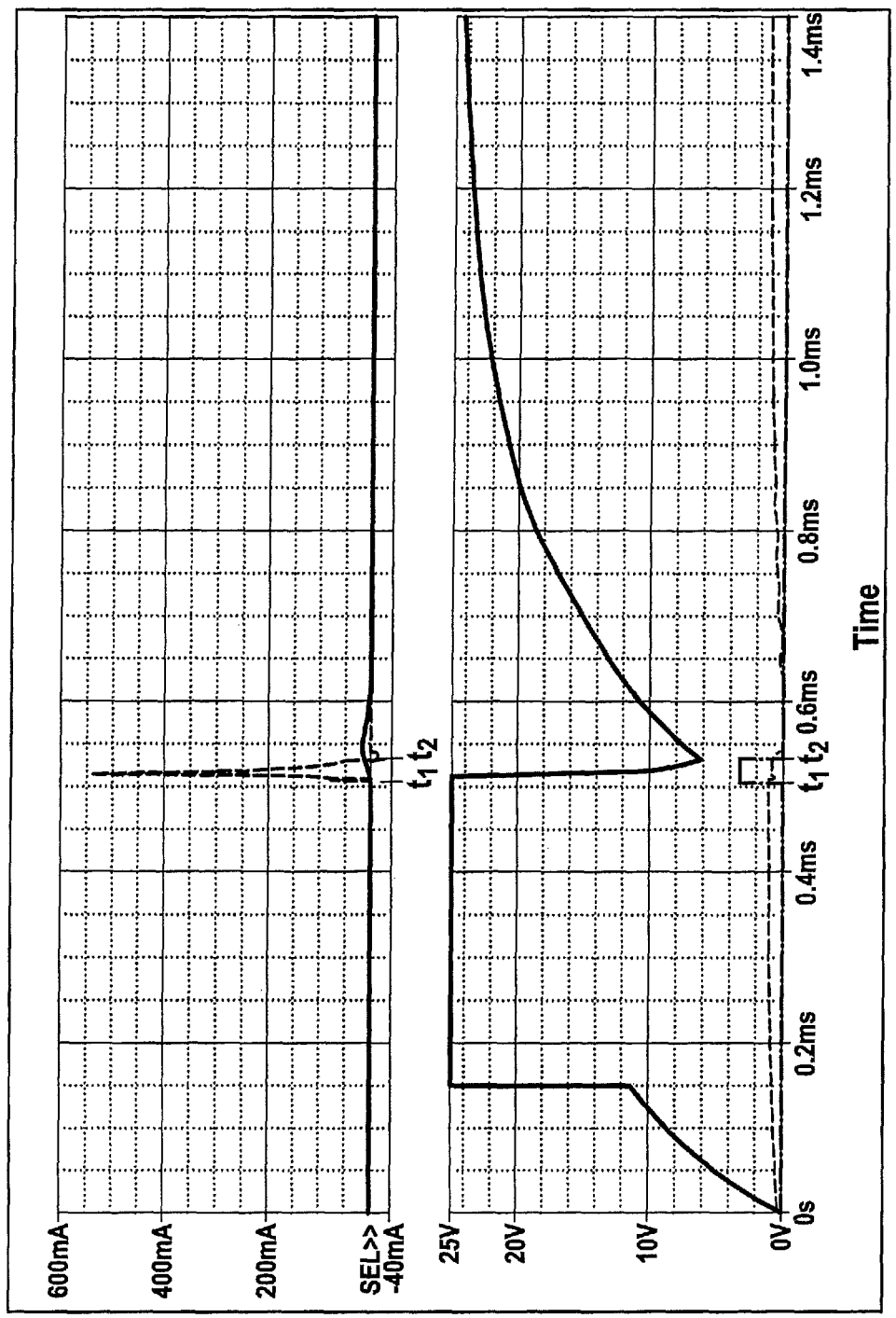
FIG. 2 shows a further diagram of a voltage/current curve.

FIG. 2 shows a diagram of an acquired voltage and current curve during execution of the method according to the present invention by the device according to the present invention, if the control device or the actuator of the present invention has been installed with wrong or reversed polarity.

In the upper diagram, the curves are plotted over time of the current through the control device, or the actuator, and through the freewheeling diode. The solid line indicates the current curve through the control device or the actuator. The dashed line indicates the current curve through the freewheeling diode.

In the lower diagram, the curves are plotted over time of the voltages at the separate energy source, e.g. an EMV capacitor, and at the second switch (HS), or high-side switch, as well as the voltage curve for the controlling of the second switch (HS), or high-side switch, and the third switch (LS), or low-side switch. Here, the solid line indicates the voltage curve at the separate energy source, e.g. an EMV capacitor, and the dashed line indicates the voltage curve at the second switch (HS), or high-side switch, and the dot-dash line indicates the voltage curve for the controlling of the second switch (HS), or high-side switch, and of the third switch (LS), or low-side switch, by a processing device (μC).

It can be seen clearly that at time t1 of the application of a voltage, there takes place no rise in voltage in the voltage curve at the second switch (HS), or high-side switch (lower diagram, dashed line). At the same time, it can be seen that a current begins to flow through the freewheeling diode (upper diagram, dashed line). The current through the control device, or the actuator, does not show any significant value (upper diagram, solid line). From this, it can be recognized that the control device, or the actuator, is not usable.

Figure 3:
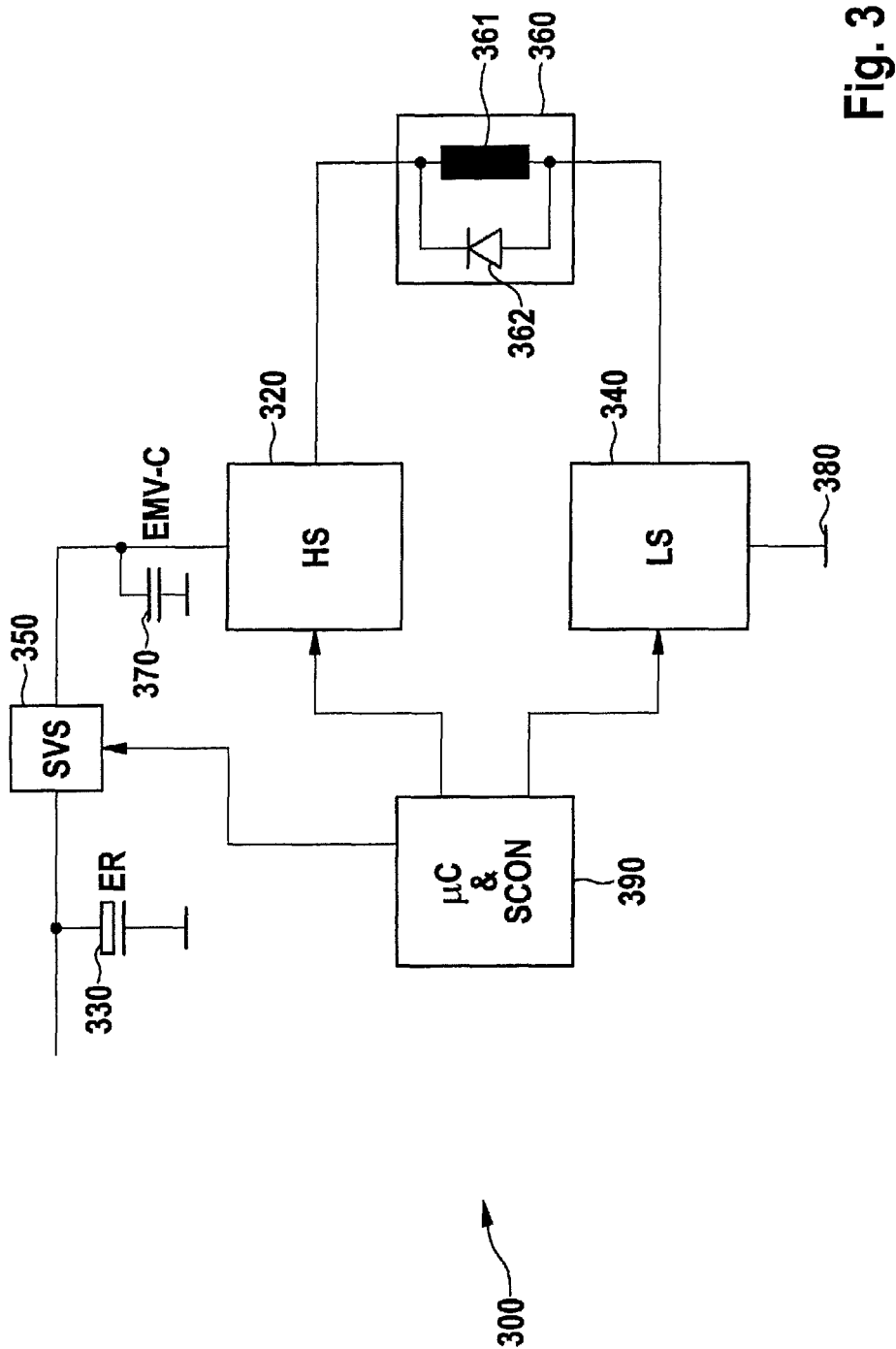
FIG. 3 shows a schematic diagram.

FIG. 3 shows a schematic diagram of a device 300 according to the present invention that has been connected with correct polarity.

Reference character 330 designates an energy reserve (ER), reference character 350 designates a first switch or safety switch (SVS), reference character 370 designates a separate energy source, here a capacitor for electromagnetic compatibility (EMV-C) of device 300, reference character 390 designates an assembly having a microcontroller (μC) and a safety controller (SCON), and the required external wiring, reference character 320 designates a second switch, or high-side switch (HS), reference character 340 designates a third switch, or low-side switch (LS), reference character 360 designates a control device or actuator, and reference character 380 designates a ground potential.

Control device or actuator 360 has at least one coil 361 and a freewheeling diode 362, as well as further mechanical elements necessary for controlling the safety devices.

Assembly 390 is fashioned to control the first switch, or safety switch (SVS), 350, the second switch, or high-side switch, 320, and the third switch, or low-side switch, 340.

In an embodiment of the method according to the present invention, first the first switch or safety switch (SVS) 350 is closed by assembly 390 in order to charge separate energy source 370, e.g. an EMV capacitor. When separate energy source 370, e.g. the EMV capacitor, has been charged, first switch or safety switch (SVS) 350 is opened. As a result, the control device, or actuator 360, can then be supplied with voltage only via separate energy source 370, e.g. the EMV capacitor. Subsequently, second switch 320 is closed by assembly 390. As a result, a voltage, provided by separate energy source 370, e.g. the EMV capacitor, is applied to actuator 360. At the same time, using a suitable method known from the existing art, voltage curves are acquired at high-side switch 320 and at low-side switch 340. The required measurement values of the voltage curves are forwarded to the microcontroller (μC). The evaluation takes place in the microcontroller (μC) in assembly 390 using suitable software or hardware circuitry. If the voltage curve at high-side switch 320 rises faster than the voltage curve at low-side switch 340, it can then be recognized that actuator 360 has been installed or connected with the correct polarity, and usability of actuator 360 can be recognized. If this is not the case, and the voltage curves at high-side switch 320 and at low-side switch 340 rise with the same speed, then actuator 360 has been installed or connected with reversed polarity. The current then flows not through coil 361, but rather through freewheeling diode 362. In this case, freewheeling diode 362 does not block, because the actuator has been installed or connected with reversed polarity.

In the schematic diagram, it can be seen that freewheeling diode 362 is opposed to the direction of current flow. If, as the result of an applied voltage, current flows through control device or actuator 360, the current then flows through coil 361. Freewheeling diode 362 blocks the flow of current.

FIG. 4 shows a diagram having current boundary values for a control device 360 of the present invention.

Time t is plotted on the abscissa; current I on the ordinate. On the abscissa, time boundary values are plotted. On the ordinate, current boundary values are plotted.

First boundary value $t_{MaxNoFire}$ on the abscissa designates a maximum time duration before a triggering is ensured not to take place even if a current flows through actuator 360 that would be minimally required for a triggering. Second boundary value $t_{MinFire}$ designates a minimum time duration for a minimum current that has to flow through actuator 360 in order for a triggering to occur. Third boundary value $t_{MaxFire}$ designates a maximum time duration for which a minimum current may flow through actuator 360 without it being possible for destruction of actuator 360 to occur.

First boundary value $I_{MaxNoFire}$ on the ordinate designates a maximum current that may flow permanently through actuator 360 without the occurrence of a triggering. Second boundary value $I_{MinFire}$ designates a minimum current that has to flow through actuator 360 in order for a triggering to be able to occur. Third boundary value $I_{MaxFire}$ designates a maximum current that may flow through actuator 360 without it being possible for destruction of actuator 360 to occur.

The six boundary values span regions. Region 410, hatched from the upper left to the lower right, designates a working region (non-triggering region) of the actuator, in which a triggering cannot occur. Cross-hatched region 420 designates a working region (gray region) in which it is not certain that a triggering will occur nor is it certain that no triggering will occur. Non-continuously hatched region 430 designates a working region (triggering region) in which it is certain that a triggering of actuator 360 will occur. Region 440, hatched from lower left to upper right, designates a working region (overload region) in which a destruction of actuator 360 can occur. Non-triggering region 410 also has a subregion 410*a*. In this region, the method according to the present invention is executed, or device 300 according to the present invention operates during the execution of the method according to the present invention.

The method according to the present invention is executed in subregion 410*a* of working region 410. In this way, it is ensured that during execution of the method according to the present invention, an undesired triggering of actuator 360 cannot occur. For this purpose, for example separate energy source 370 is correspondingly dimensioned. The energy source cannot provide enough energy, or voltage, or current, to operate actuator 360 in a region other than subregion 410*a* of working region 410.

Figure 5A:
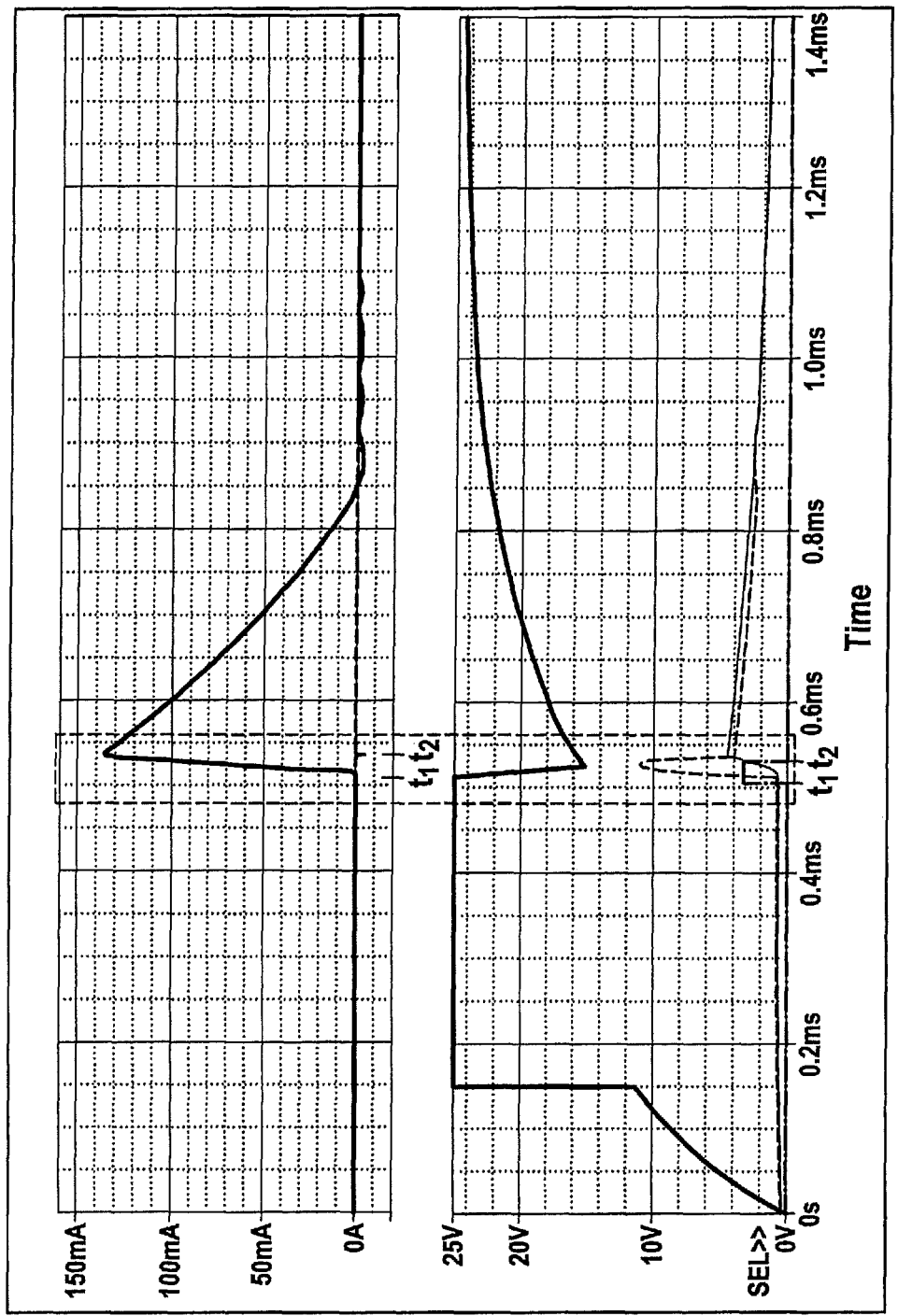
FIG. 5a shows a further diagram of a voltage/current curve.

FIG. 5*a* shows a diagram of an acquired voltage and current curve during execution of the method according to the present invention by the device according to the present invention, if the control device, or the actuator, of the present invention has been connected with correct polarity.

In the upper diagram, the curves are plotted over time of the current through the control device, or the actuator, and through the freewheeling diode. The solid line indicates the current curve through the control device or the actuator. The dashed line indicates the current curve through the freewheeling diode.

In the lower diagram, the curves are plotted over time of the voltage measured at the separate energy source, e.g. an EMV capacitor, and at the second switch (HS), or the high-side switch, as well as the voltage curve required for the controlling only of the second switch (HS), or high-side switch, as well as the voltage curve measured at the third switch (LS), or low-side switch. The thick solid line here indicates the voltage curve at the separate energy source, e.g. an EMV capacitor, and the dashed line indicates the voltage curve at the second switch (HS), or high-side switch, and the dot-dash line indicates the voltage curve for the controlling of only the second switch (HS), or high-side switch, by a processing device (μC). The thin solid line indicates the voltage curve measured at the third switch (LS), or low-side switch.

It can be seen clearly that at time t1 of the application of a voltage, a rise in voltage takes place in the voltage curve at the high-side switch (HS). A rise in voltage in the voltage curve at the low-side switch (LS) takes place more slowly. At the same time, it can be seen that a current begins to flow through the actuator. The current through the freewheeling diode does not have any significant value. From this, the usability of the control device, or actuator, is recognized.

Figure 5B:
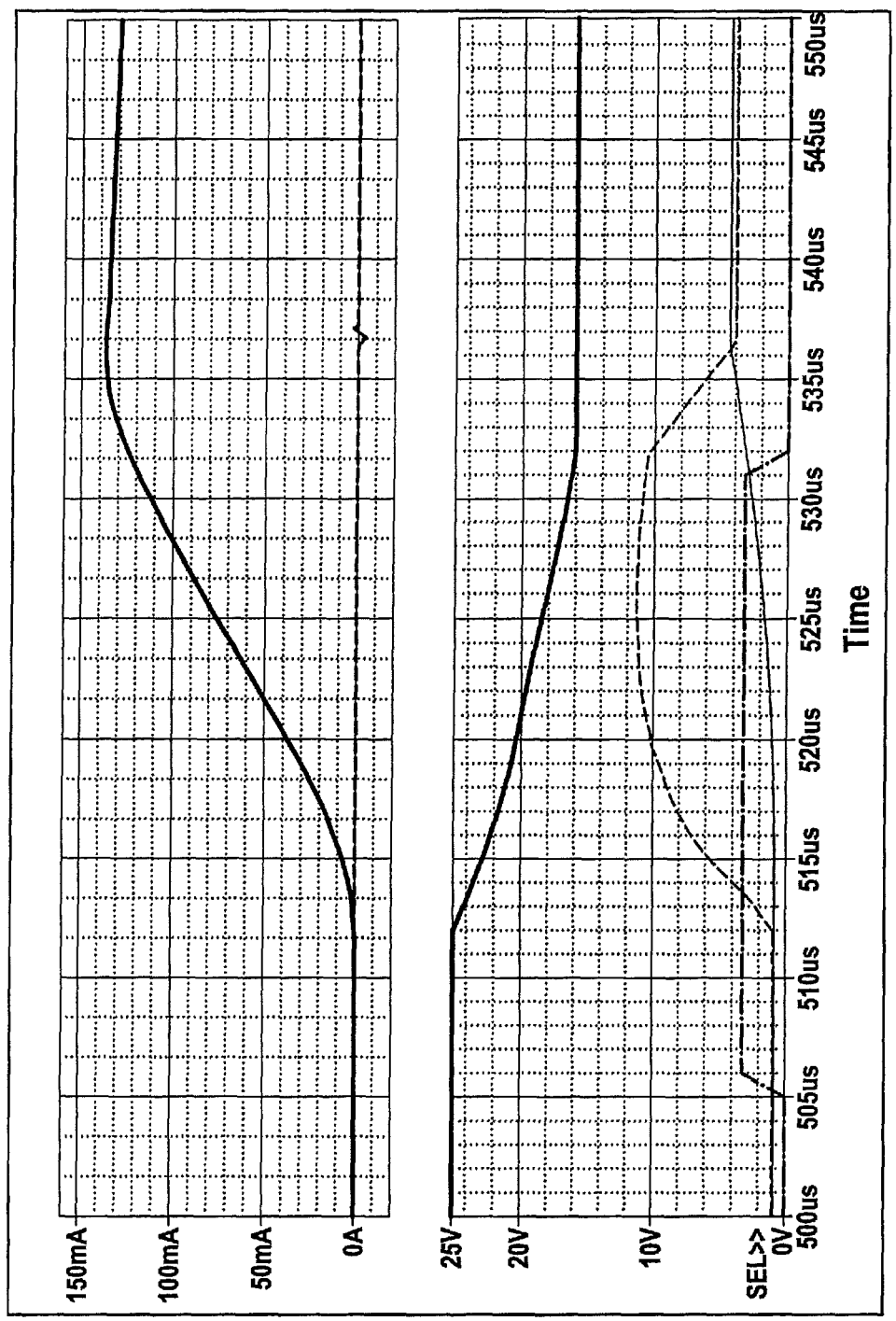
FIG. 5b shows an enlarged region of a diagram of a voltage/current curve.

FIG. 5*b* shows an enlarged segment around the region around times t1 and t2. Here, the rises in voltage in the voltage curves at the high-side switch (HS) and low-side switch (LS) can be seen still more clearly.

In FIG. 5*b*, it can be seen clearly that the rise in voltage at the low-side switch (LS) takes place more slowly than at the high-side switch (HS). Accordingly, the actuator is ready for use, because the current can flow through the coil of the actuator.

Figure 6A:
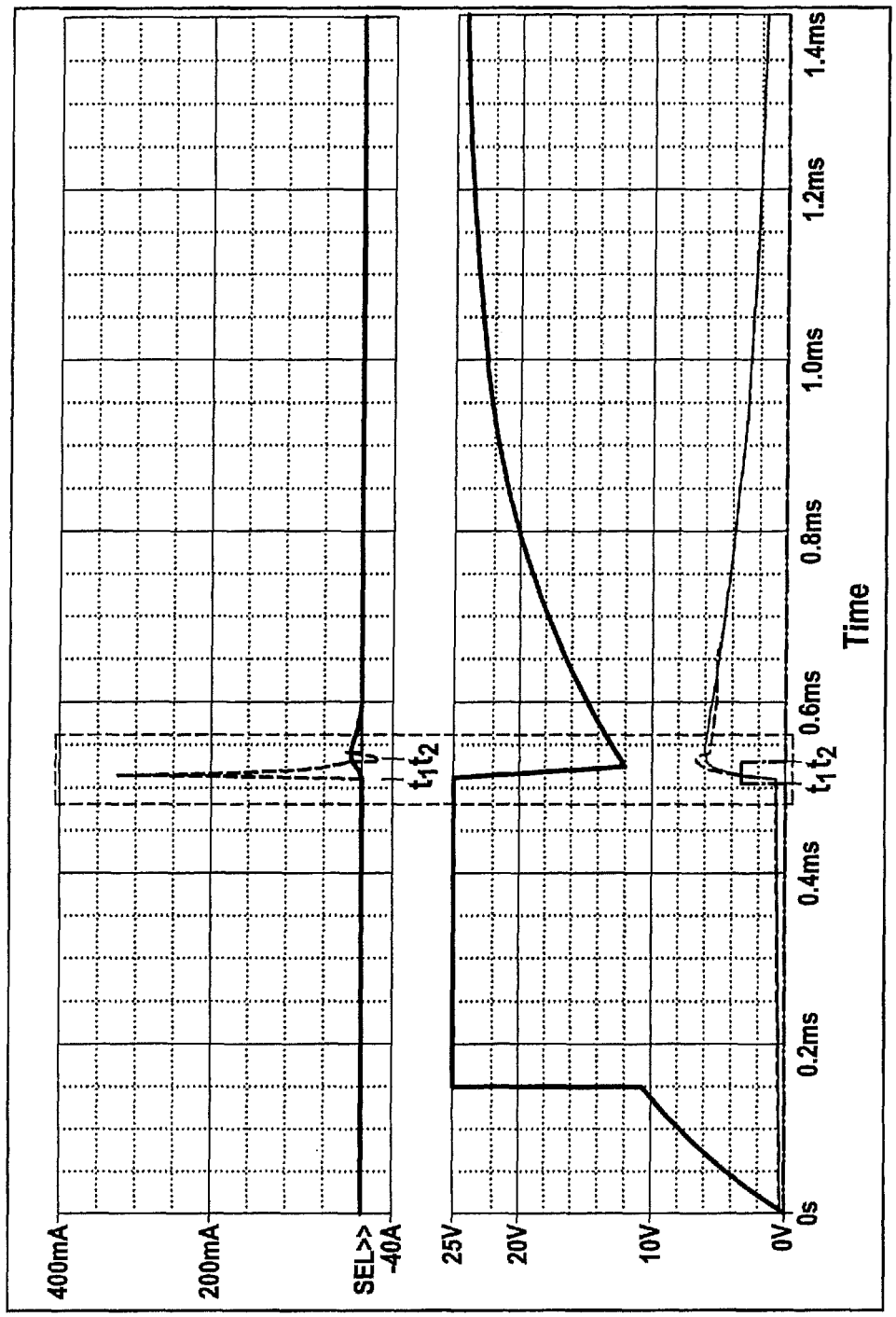
FIG. 6a shows a further diagram of a voltage/current curve.

FIG. 6*a* shows a diagram of an acquired voltage and current curve during execution of the method according to the present invention by the device according to the present invention, if the control device, or actuator, of the present invention has been connected with wrong polarity, or reversed polarity.

In the upper diagram, the curves are plotted over time of the current through the control device, or actuator, and through the freewheeling diode. The solid line here indicates the current curve through the control device, or actuator. The dashed line indicates the current curve through the freewheeling diode.

In the lower diagram, the curves are plotted over time of the voltage measured at the separate energy source, for example an EMV capacitor, at the second switch (HS), or high-side switch, as well as the voltage curve required for the controlling only of the second switch (HS), or high-side switch, as well as the voltage curve measured at the third switch (LS), or low-side switch. The thick solid line here indicates the voltage curve at the separate energy source, e.g. an EMV capacitor, and the dashed line indicates the voltage curve at the second switch (HS), or high-side switch, and the dot-dash line indicates the voltage curve for controlling only the second switch (HS), or high-side switch, by a processing device (μC). The thin solid line indicates the voltage curve measured at the third switch (LS), or low-side switch.

It can be seen clearly that at time t1 of the application of a voltage, a rise in voltage takes place in the voltage curve at the high-side switch (HS). At the same time, a rise in voltage in the voltage curve at the low-side switch (LS) takes place with the same speed, or substantially the same speed. At the same time, it can be seen that a current begins to flow through the freewheeling diode. The current through the control device, or actuator, does not have any significant value. From this it can be inferred that the control device, or actuator, is not usable.

Figure 6B:
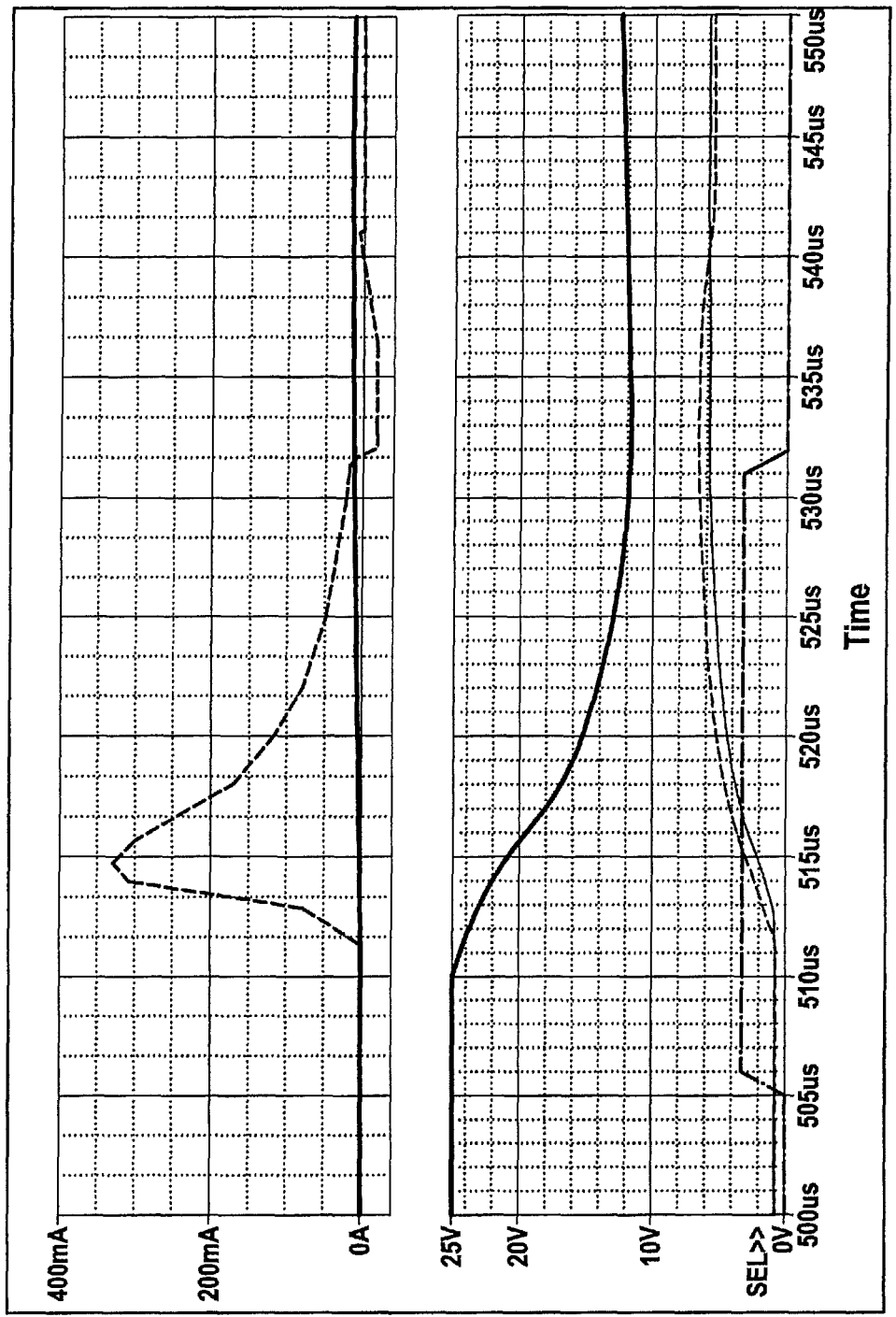
FIG. 6b shows an enlarged region of a diagram of a voltage/current curve.

FIG. 6*b* shows an enlarged segment around the region around times t1 and t2. Here, the rises in voltage in the voltage curves at the high-side switch (HS) and low-side switch (LS) can be seen still more clearly.

In FIG. 6*b*, it can be seen clearly that the rise in voltage at the low-side switch (LS) and at the high-side switch (HS) take place equally quickly, or substantially equally quickly. Accordingly, the actuator is not ready for use, because the current can flow through the freewheeling diode of the actuator.

Figure 7:
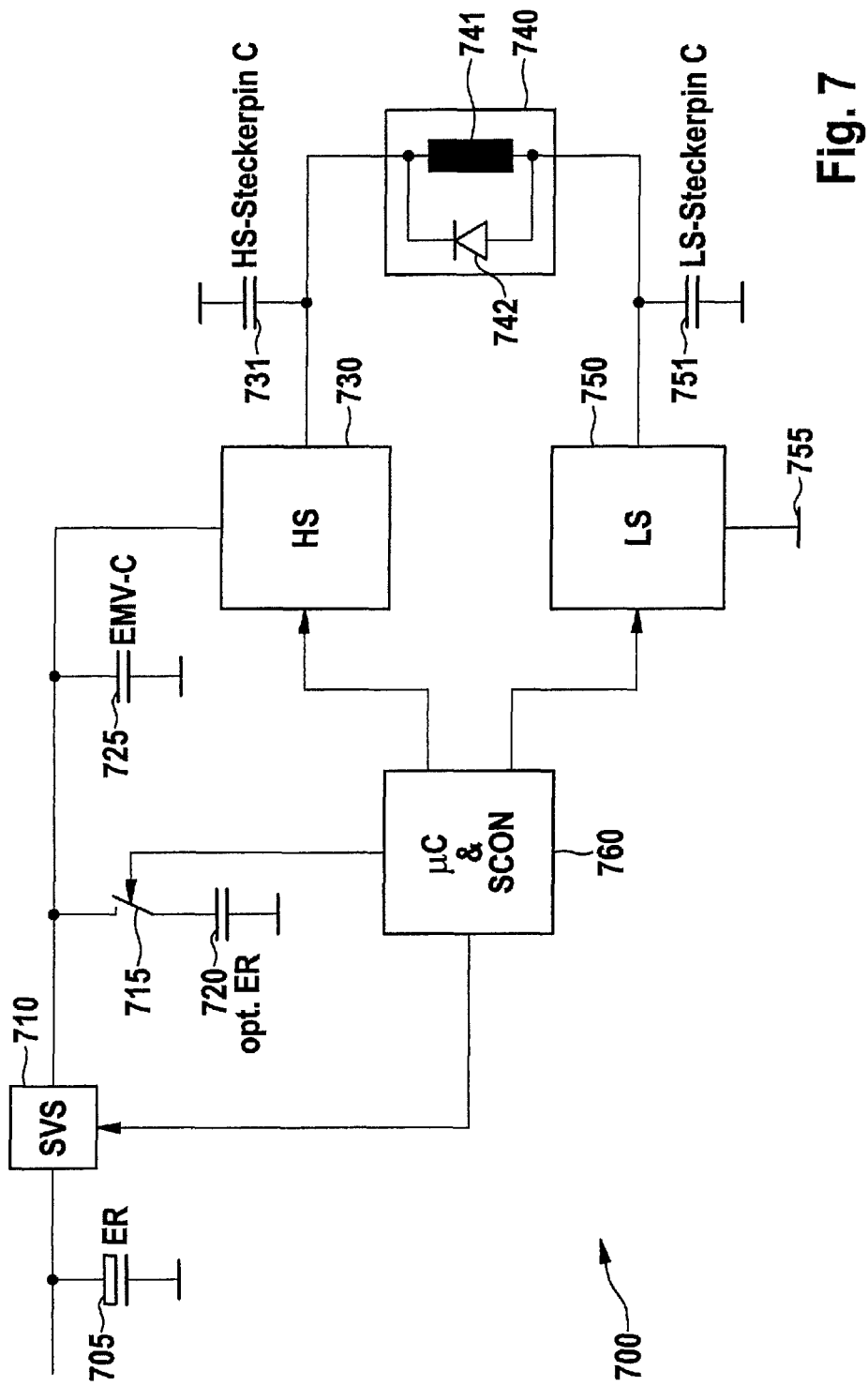
FIG. 7 shows a further schematic diagram.

FIG. 7 shows a schematic diagram of an alternative specific embodiment of a device 700 according to the present invention that has been connected with correct polarity.

Reference character 705 designates an energy reserve (ER), reference character 710 designates a first switch, or safety switch (SVS), reference character 715 designates a further switch for a further optional energy source, reference character 720 designates a further optional energy source, reference character 725 designates a capacitor for realizing an EMV compatibility of device 700, a so-called EMV capacitor, reference character 730 designates a second switch or high-side switch, reference character 731 designates a capacitor of the high-side switch, reference character 740 designates an actuator, reference character 741 designates a coil of the actuator, reference character 742 designates a freewheeling diode of the actuator, reference character 751 designates a capacitor of the low-side switch, reference character 750 designates a third switch or low-side switch, reference character 755 designates a ground potential, and reference character 760 designates an assembly having at least one microcontroller (μC) and a safety controller (SCON), as well as the required external circuitry.

Although the capacitors of high-side switch 731 and of low-side switch 751 are shown separately, the capacitors can be part of the respective switch, or part of device 700, if switches 730, 750, or device 700, are for example fashioned as integrated circuits (ASIC).

Assembly 760 is fashioned to control first switch or safety switch (SVS) 710, further switch 715 for a further optional energy source 720, high-side switch 730, and low-side switch 750.

In the alternative specific embodiment of device 700 according to the present invention according to FIG. 7, the separate energy source has been realized via a further optional energy source 715. In order to carry out the method according to the present invention, energy is provided or voltage is applied to actuator 740 by assembly 760, i.e. by the microcontroller (μC) or by the safety controller (SCON), via switch 715.

The voltage curve can then be acquired at the capacitors of high-side switch 731 and low-side switch 751.

In a specific embodiment that is not explicitly shown of the device according to the present invention, the separate energy source is realized exclusively by the capacitor for EMV compatibility 370, 725. In such a specific embodiment, the device according to the present invention does not have an optional further energy source 330, 720, and also does not have a switch for optional further energy source 715.

The controlling for the switchable elements safety switch (SVS), high-side switch (HS), and low-side switch (LS), as well as for optional further energy reserve 720, can take place both through the microcontroller (μC), with the aid of software, i.e. a suitable program stored on a suitable data carrier, as well as in a completely hardware-controlled manner using suitable hardware logic, for example using the safety controller (SCON), a second (safety) microcontroller, FPGA, PAL, GAL, etc.

A mixed controlling is also possible. Here, the microcontroller (μC) controls for example safety switch (SVS) 710 and optional further energy reserve 330, 720 using software. High-side switch (HS) 320, 730 and low-side switch (LS) 340, 750 are controlled via a separate hardware path, for example via the safety controller (SCON).

Figure 8:
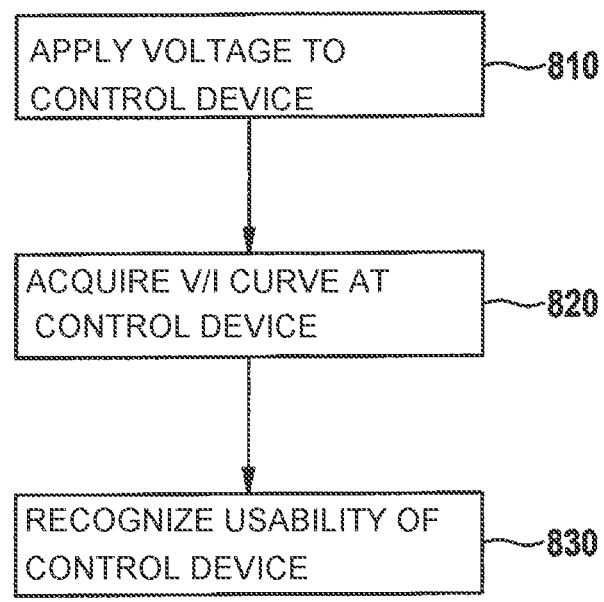
FIG. 8 shows a flow diagram of the method.

FIG. 8 shows a flow diagram of the method according to the present invention.

In step 810, a voltage is applied to control device 360, 740.

In step 820, a voltage curve or current curve is acquired at control device 360, 740, for example through the acquisition of a voltage curve at high-side switch (HS) 320, 730 and at low-side switch 340, 750.

In step 830 a usability of control device 360, 740 is recognized as a function of the acquired voltage curve or current curve. For example, through the course of the voltage curve, in particular a rise in voltage at high-side switch (HS) 320, 730 that takes place more quickly than a voltage curve, in particular a rise in voltage, at low-side switch (LS) 340, 750, it can be recognized that control device 360, 740 has been installed or put into place with the correct polarity and is therefore usable.

If the method according to the present invention yields the result that the control device, or actuator, is not usable, then the method can be multiply repeated up to error qualification. In the present context, an error qualification can be understood as meaning that an error entry is made to an error storage device, or a warning lamp is controlled in order to signal to the driver that the safety devices in the vehicle are not completely usable.

What is claimed is:

1. A method for recognizing a usability of a control device of a safety device in a vehicle, comprising:
   applying a voltage to the control device, which has a preferred direction of current flow;
   acquiring a high-side voltage curve and a low-side voltage curve at the control device; and
   recognizing a usability of the control device;
   wherein the recognizing of the usability of the control device includes determining that the control device, which has a preferred direction of current flow, has been installed in a correct direction, so that current can flow in the preferred direction,
   wherein the control device includes a free-wheeling diode in parallel with a control element,
   wherein if the high-side voltage curve at a high-side switch, which is coupled on a high side of the control device, rises faster than the low-side voltage curve at a low-side switch, which is coupled on a low side of the control device, it is recognized that the safety device has been connected with a correct polarity, and the usability of the control device is recognized, since the current flows through the control element and not through the free-wheeling diode,
   wherein if the high-side voltage curve at the high-side switch and the low-side voltage curve at the low-side switch rises with about the same speed, then the safety device has been connected with a reversed or incorrect polarity, and the usability of the control device is not recognized, since the current does not flow through the control element, but instead flows through the free-wheeling diode that does not block the current because the control device has been installed or connected with reversed polarity,
   wherein the high-side switch is coupled to a blocking end of the free-wheeling diode and the low-side switch is coupled to the other end of the free-wheeling diode, the low-side switch being coupled to ground,
   wherein the high-side switch is situated upstream, in a direction of a current flow, from the control device having the control element, and
   wherein the low-side switch is situated downstream, in a direction of the current flow, from the control device having the control element.

2. The method as recited in claim 1, wherein the voltage from a first energy source separate from an energy source of the vehicle is applied in the applying of the voltage to the control device, the method further comprising:
   charging the first energy source.

3. The method as recited in claim 2, wherein the first energy source is connected to the energy source of the vehicle through a first switch, and wherein in the step of charging, the first energy source is charged through the closed first switch.

4. The method as recited in claim 3, wherein the connection to the energy source of the vehicle is disconnected by opening of the first switch after the charging of the first energy source.

5. The method as recited in claim 2, wherein the control device has at least one of a time boundary value and a current boundary value, wherein the control device is not triggered if the voltage is applied to the control device for a time period not greater than the time boundary value, and wherein the control device is not triggered when a current flowing through the control device is not greater than the current boundary value, the method further comprising:
   disconnecting the applied voltage of one of: (i) after the time period not greater than the time boundary value, and (ii) before the current flowing through the control device reaches the current boundary value.

6. The method as recited in claim 5, wherein the control device is connected to the high-side switch, and wherein the voltage is applied to the control device via the high-side switch in the closed state in the step of applying the voltage to the control device.

7. The method as recited in claim 6, wherein the control device is configured to be selectively triggered by the high-side switch and the low-side switch, and wherein a triggering of the control device is prevented if the the low-side switch is open.

8. The method as recited in claim 2, wherein the usability of the control device is recognized when the acquired voltage curve has a characteristic rise in voltage.

9. The method as recited in claim 8, wherein the acquired voltage curve is compared in the recognizing step to a voltage boundary value.

10. The method as recited in claim 9, wherein the usability of the control device is recognized as not present when the acquired voltage curve does not have the characteristic rise in voltage.

11. The method as recited in claim 9, wherein the usability of the control device is recognized if a correct polarity of the control device is present.

12. A device for recognizing a usability of a control device of a safety device in a vehicle, comprising:
   a voltage applying arrangement to apply a voltage to the control device, which has a preferred direction of current flow;
   an acquiring arrangement to acquire a high-side voltage curve and a low-side voltage curve at the control device; and
   a recognizing arrangement to recognize a usability of the control device;
   wherein the recognizing of the usability of the control device includes determining that the control device, which has a preferred direction of current flow, has been installed in a correct direction, so that current can flow in the preferred direction,
   wherein the control device includes a free-wheeling diode in parallel with a control element,
   wherein if the high-side voltage curve at a high-side switch, which is coupled on a high side of the control device, rises faster than the low-side voltage curve at a low-side switch, which is coupled on a low side of the control device, it is recognized that the safety device has been connected with a correct polarity, and the usability of the control device is recognized, since the current flows through the control element and not through the free-wheeling diode,
   wherein if the high-side voltage curve at the high-side switch and the low-side voltage curve at the low-side switch rises with about the same speed, then the safety device has been connected with a reversed or incorrect polarity, and the usability of the control device is not recognized, since the current does not flow through the control element, but instead flows through the free-wheeling diode that does not block the current because the control device has been installed or connected with reversed polarity,
   wherein the high-side switch is coupled to a blocking end of the free-wheeling diode and the low-side switch is coupled to the other end of the free-wheeling diode, the low-side switch being coupled to ground,
   wherein the high-side switch is situated upstream, in a direction of a current flow, from the control device having the control element, and
   wherein the low-side switch is situated downstream, in a direction of the current flow, from the control device having the control element.

13. The device as recited in claim 12, further comprising:
a first energy source for providing the voltage for application to the control device.

14. The device as recited in claim 13, further comprising:
a safety switch;
wherein the vehicle has a further energy source, and wherein the first energy source is selectively connected to the further energy source of the vehicle through the safety switch in the closed state to charge the first energy source.

15. The device as recited in claim 14, wherein:
the control device has at least one of a time boundary value and a current boundary value, and the control device is not triggered if the voltage is applied to the control device for a time period not greater than the time boundary value, and the control device is not triggered when a current flowing through the control device is not greater than the current boundary value; and
the first energy source has a capacitor storing at most a predefined amount of energy such that the voltage is able to be applied to the control device at least one of (i) for at most a time period corresponding to the time boundary value, and (ii) for at most a time period until a current which corresponds to the current boundary value flows through the control device.

16. The device as recited in claim 15, wherein the control device has the high-side switch and the low-side switch each configured to be selectively closed to control the safety device, and wherein the voltage applying arrangement to apply the voltage closes the high-side switch and does not close the low-side switch.

17. The device as recited in claim 16, wherein the first energy source is situated between the safety switch and the high-side switch.

18. The device as recited in claim 17, wherein the control device has at least one inductive electrical component.

19. The device as recited in claim 17, wherein the usability of the control device is recognized if a correct polarity of the control device is present.

* * * * *